(12) United States Patent
Kim et al.

(10) Patent No.: US 9,941,877 B2
(45) Date of Patent: Apr. 10, 2018

(54) ELECTRODE PATTERN OF TOUCH PANEL

(71) Applicant: LG INNOTEK CO., LTD., Seoul (KR)

(72) Inventors: Jong Sun Kim, Seoul (KR); Dong Keon Lee, Seoul (KR); Chan Kyu Koo, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 140 days.

(21) Appl. No.: 14/365,452

(22) PCT Filed: Dec. 11, 2012

(86) PCT No.: PCT/KR2012/010747
§ 371 (c)(1),
(2) Date: Jun. 13, 2014

(87) PCT Pub. No.: WO2013/094919
PCT Pub. Date: Jun. 27, 2013

(65) Prior Publication Data
US 2015/0001060 A1    Jan. 1, 2015

(30) Foreign Application Priority Data

Dec. 19, 2011 (KR) .................. 10-2011-0136998

(51) Int. Cl.
*G06F 3/044* (2006.01)
*H03K 17/96* (2006.01)
*G06F 1/16* (2006.01)

(52) U.S. Cl.
CPC ......... *H03K 17/962* (2013.01); *G06F 1/1692* (2013.01); *G06F 3/044* (2013.01);
(Continued)

(58) Field of Classification Search
CPC .......... G06F 3/044; G06F 2203/04111; G06F 2203/04103; G06F 2203/04112
(Continued)

(56) References Cited

U.S. PATENT DOCUMENTS

2008/0277259 A1   11/2008  Chang
2009/0160824 A1    6/2009  Ting Chin-Yung et al.
(Continued)

FOREIGN PATENT DOCUMENTS

KR   10-2011-0095684 A   8/2011
KR      10-1055379 B1    8/2011
(Continued)

OTHER PUBLICATIONS

International Search Report in International Application No. PCT/KR2012/010747, filed Dec. 11, 2012.
(Continued)

*Primary Examiner* — Ahmed Saeed
(74) *Attorney, Agent, or Firm* — Saliwanchik, Lloyd & Eisenschenk

(57) ABSTRACT

Provided is an electrode pattern of a touch panel, including: a plurality of conductive pattern cells which are formed to be spaced apart from each other on a substrate; and an insulating layer which is formed on the conductive pattern cells; and a plurality of metal bridge line electrodes which are formed on the insulating layer so that the conductive pattern cells are connected to each other.

10 Claims, 3 Drawing Sheets

(52) U.S. Cl.
    CPC ............... *H03K 2017/9613* (2013.01); *H03K 2217/96075* (2013.01); *H03K 2217/960755* (2013.01)

(58) Field of Classification Search
    USPC .................................. 200/600; 345/173, 178
    See application file for complete search history.

(56)              References Cited

U.S. PATENT DOCUMENTS

| | | |
|---|---|---|
| 2009/0242283 A1 | 10/2009 | Chiu |
| 2010/0295819 A1 | 11/2010 | Ozeki et al. |
| 2010/0328248 A1 | 12/2010 | Mozdzyn |
| 2011/0141037 A1 | 6/2011 | Hwang et al. |
| 2011/0304578 A1 | 12/2011 | Kim et al. |

FOREIGN PATENT DOCUMENTS

| | | | | |
|---|---|---|---|---|
| KR | 20110095684 | * | 8/2011 | ............. H01H 13/14 |
| WO | WO-2010-101399 A2 | | 9/2010 | |

OTHER PUBLICATIONS

Extended European Search Report dated Jul. 7, 2015 for European Application No. 12859234.2-1972.

* cited by examiner

--Prior Art--

--Prior Art--

[Fig. 3]
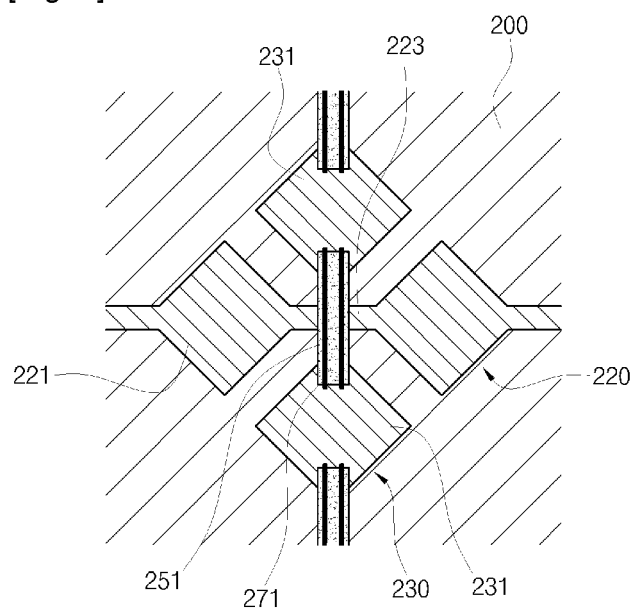
[Fig. 4]
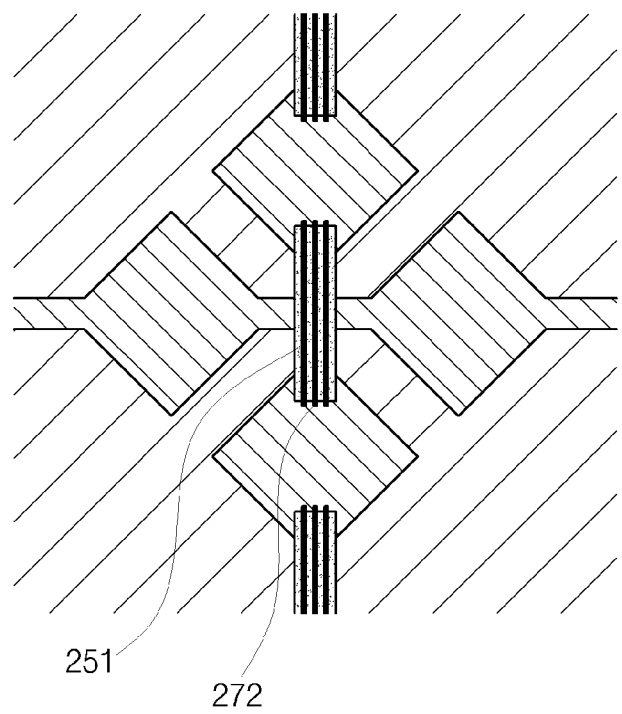

ELECTRODE PATTERN OF TOUCH PANEL

CROSS-REFERENCE TO RELATED APPLICATIONS

This application is the U.S. national stage application of International Patent Application No. PCT/KR2012/010747, filed Dec. 11, 2012, which claims priority to Korean Application No. 10-2011-0136998, filed Dec. 19, 2011, the disclosures of each of which are incorporated herein by reference in their entirety.

TECHNICAL FIELD

The present invention relates to an electrode pattern of a touch panel, more specifically, to an electrode pattern of a touch panel in which a metal bridge line electrode for connecting the electrode pattern is formed.

BACKGROUND ART

In electronic devices such as personal digital assistants (PDA), laptop computers, OA devices, medical devices or car navigation and the like, a touch panel for providing an input means (i.e. a pointing device) in their displays has been widely used. It has been known that a representative touch panel adopts a capacitive type as well as a resistive type, an electromagnetic induction type, an optical type and the like.

In general, the capacitive type is divided into an analogue type and a digital type.

In the analogue type, a sensor electrode is an electrode in a sheet shape, and no pattern is required within a sensing operation area. On the contrary, the digital type needs a pattern of an electrode for a sensor within a sensing operation area. In this digital type, the capacitive touch panel adopts a variation in capacitance generated between a transparent electrode and electrostatics of the human body to induce currents which become a basis for confirming a touch position. To detect the position of a touch panel to which the human body such as fingers or a stylus is touched, various technologies for the capacitive touch panel have been developed.

As one example, U.S. Pat. No. 6,970,160 discloses a lattice touch-sensing system for detecting a position of a touch on a touch-sensitive surface. The lattice touch-sensing system may include two capacitive sensing layers, separated by an insulating material, where each layer consists of substantially parallel conducting elements, and the conducting elements of the two sensing layers are substantially orthogonal to each other. Each element may comprise a series of diamond shaped patches that are connected together with narrow conductive rectangular strips. Each conducting element of a given sensing layer is electrically connected at one or both ends to a lead line of a corresponding set of lead lines. A control circuit may also be included to provide an excitation signal to both sets of conducting elements through the corresponding sets of touch on the surface occurs, and to determine a position of the touch based on the position of the affected bars in each layer.

The capacitive type as described above is mainly composed of the configuration including two capacitive sensing layers. The two capacitive sensing layers are formed to have a space with an insulating material between the layers to bring about a capacitive effect between the layers. Due to this configuration, a structure of the panel becomes very thick, thereby going against a tendency for a small size in product. Moreover, the conventional capacitive touch panel includes a substrate on both surfaces in which two capacitive sensing layers are formed, respectively. In the light of this, through holes should be formed on the substrate so as to function as a bias. The circuit layering should be adopted to appropriately connect the conducting elements of the sensing layers. This makes a production of the capacitive touch panel difficult and complex.

Accordingly, to settle the problem, technologies for reducing two capacitive sensing layers to one capacitive sensing layer have been used.

FIG. 1 is a view illustrating an electrode pattern of a touch panel according to a conventional art. FIG. 2 is a cross-sectional view for explaining the electrode pattern of the touch panel according to the conventional art. The conventional touch panel and electrode pattern will be explained with reference to FIG. 1 and FIG. 2.

As illustrated in FIG. 1 and a on FIG. 2, on a substrate 110, a first-axis (Rx) capacitive pattern 120 is formed and second-axis (Tx) capacitive transparent pattern cells 131 are formed. These electrode patterns are illustrated as cross sections in FIG. 2.

At this time, as a method of forming the first-axis conductive pattern 120 and the second-axis conductive transparent pattern cells, an etching process, a sputtering process or a screen printing process may be used. Furthermore, as a material for the transparent pattern, indium-tin oxide (ITO) has been generally used.

Then, as illustrated in b on FIG. 2, a photo resist layer 10 is formed on the second-axis capacitive pattern cells 131, and thereafter, an insulating material is applied thereto, thereby forming a layer 40 to which the insulating material is applied.

Then, the photo resist 10 is removed, thereby forming an insulating layer 50 as illustrated in c on FIG. 2. On the insulating layer 50 formed like this, a bridge electrode 90 is formed, so the second-axis (Tx) conductive pattern cells 131 spaced apart from each other are electrically connected to each other.

However, because the conventional electrode pattern of the touch panel was problematic that the bridge electrode for connecting the conductive pattern cells 131 to each other is visible to the user's naked eye, a width of the bridge electrode was formed in 10 μm, but the problem in electric conductivity was generated. Accordingly, the bridge electrode was formed using a metal, but due to a difference in reflectance and color between the metal and an LCD around it, it was also problematic that the bridge electrode is visible to the naked eye.

Like this, to solve the problem in that the bridge electrode is visible to the naked eye, transparent materials such as ITO (Indium Tin Oxide), IZO (Indium Zinc Oxide), a carbon nano tube (CNT) and the like may be used. However, in this case, due to a cost problem for the materials and a limitation in conductivity of a transparent electrode, it is problematic that a design to reduce a width of the electrode cannot be made.

DISCLOSURE OF INVENTION

Technical Problem

Accordingly, the present invention has been made keeping in mind the above problems occurring in the related art. An aspect of the present invention provides an electrode pattern of a touch panel which is configured such that a bridge electrode is formed in a slit shape composed of a plurality of thin metal bridge line electrodes to reduce a width thereof, thereby solving the problem such as a reduction in visibility between metal bridge line electrodes and pixels caused by diffraction and interference at the same time as not blocking out the light of a lower part.

Solution to Problem

According to an aspect of the present invention, there is provided an electrode pattern of a touch panel, including: a plurality of conductive pattern cells which are formed to be spaced apart from each other on a substrate; an insulating layer which is formed on the conductive pattern cells; and a plurality of metal bridge line electrodes which are formed on the insulating layer so that the conductive pattern cells are connected to each other.

Advantageous Effects of Invention

According to the present invention, the bridge electrode is formed in a slit shape composed of the plurality of thin metal bridge line electrodes to reduce a width thereof, thereby solving the problem such as a reduction in visibility between metal bridge line electrodes and pixels caused by diffraction and interference at the same time as not blocking out the light of a lower part.

According to the present invention, electric conductivity of the bridge electrodes can be secured, and at the same time, the problem that the bridge electrode is visible to the user's naked eye can be solved.

BRIEF DESCRIPTION OF DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings:

FIG. 3 is a view illustrating an electrode pattern of a touch panel according to an exemplary embodiment of the present invention.

FIG. 4 is a view illustrating an electrode pattern of a touch panel according to another exemplary embodiment of the present invention.

MODE FOR THE INVENTION

Figure 1:
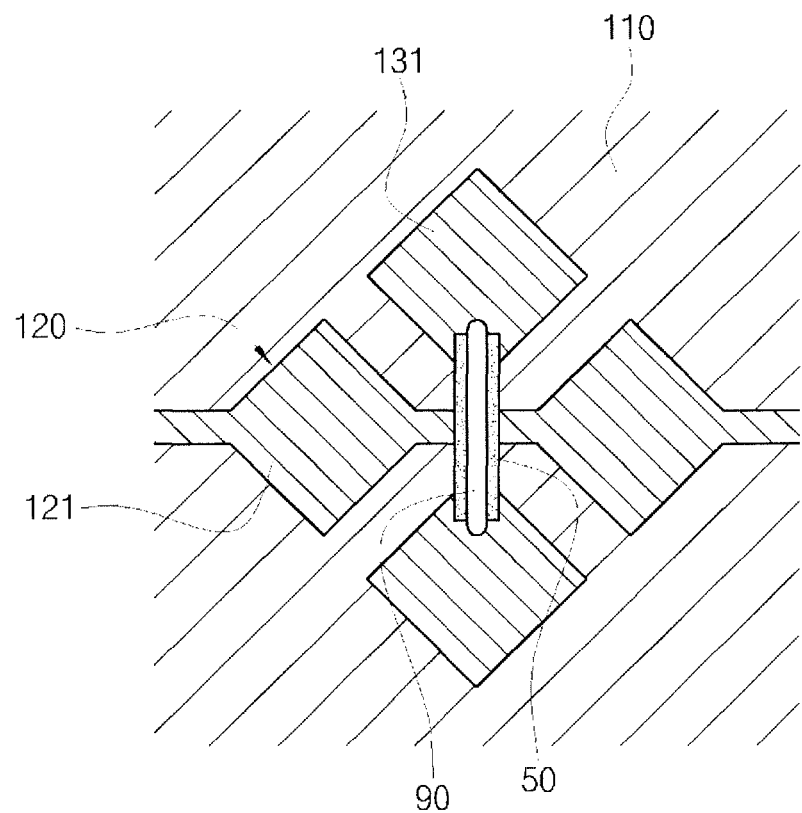
FIG. 1 is a view illustrating an electrode pattern of a touch panel according to a conventional art.
Figure 2:
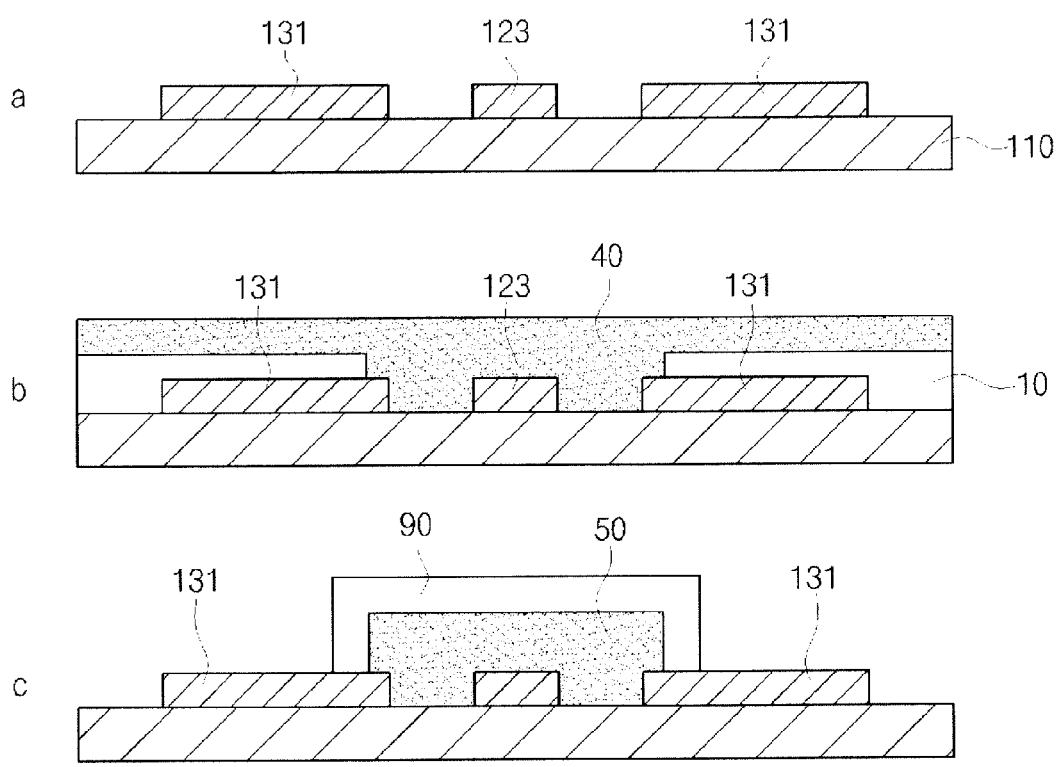
FIG. 2 is a cross-sectional view for explaining the electrode pattern of the touch panel according to the conventional art.

Hereinafter, preferred embodiments of the present invention will be described in detail with reference to the accompanying drawings. In the following description, it is to be noted that, when the functions of conventional elements and the detailed description of elements related with the present invention may make the gist of the present invention unclear, a detailed description of those elements will be omitted. Further, it should be understood that the shape and size of the elements shown in the drawings may be exaggeratedly drawn to provide an easily understood description of the structure of the present invention rather than reflecting the actual sizes of the corresponding elements.

An electrode pattern of a touch panel according to an exemplary embodiment of the present invention will be explained with reference to FIG. 3 and FIG. 4.

FIG. 3 and FIG. 4 are views illustrating an electrode pattern of the touch panel according to an exemplary embodiment of the present invention.

As illustrated in FIG. 3, on a substrate 200, a first conductive pattern 220 connected in a direction of a first axis (Rx) is formed, and second conductive pattern cells 231 which are spaced apart from each other in a direction of a second axis (Tx) are formed. The first conductive pattern 220 is configured of first conductive pattern cells 221 and a conductive lead 223.

At this time, the first conductive pattern cells 221 are connected to each other by the conductive lead 223. Furthermore, the first conductive cells 221, the second conductive cells 231, and the conductive lead 223 may be formed of ITO (Indium Tin Oxide), IZO (Indium Zinc Oxide), ZnO (Zinc Oxide), a carbon nano tube (CNT), an Ag nano wire, a conductive polymer or graphene.

Here, the first conductive pattern 220 and a second conductive pattern 230 may be substantially perpendicular to each other. However, of course, they may be arranged on a surface of a substrate at an angle including an angle between them that is not perpendicular.

The substrate 200 may be formed of a transparent window. At this time, the transparent window may be formed of any one of tempered glass, half tempered glass, soda-lime glass and tempered plastic.

An insulating layer 251 is disposed on the first conductive pattern 220 and the second conductive pattern 230. The insulating layer 251 may be formed using an offset process or an ink jet process. More specifically, the insulating layer 251 is formed in an upper part of the conductive lead 223 and the second conductive pattern cells.

Metal bridge line electrodes 271 are formed on the insulating layer 251 so that the second conductive cells are electrically connected to each other.

As illustrated in FIG. 3, the metal bridge line electrodes 271 form a pair of metal bridge line electrodes 271. The metal bridge line electrodes 271 are formed to be parallel to each other.

At this time, the metal bridge line electrodes 271 may be formed in a slit shape to face each other. That is, as illustrated in FIG. 3, the metal bridge line electrodes 271 may be formed in the shape of a pair of thin metal bridge lines facing each other.

Also, according to another exemplary embodiment of the present invention, as illustrated in FIG. 4, the metal bridge line electrodes may be formed on the insulating layer 251 in two slit shapes which are configured of three metal bridge line electrodes. That is, the metal bridge line electrodes may be formed of three metal bridge line electrodes 272 to be parallel to each other so as to form two slit shapes.

Also, in the exemplary embodiment of FIG. 4, the metal line bridge electrodes 272 are also formed to be parallel to each other.

At this time, the sum of widths of the metal bridge line electrodes 271, 272 formed as described above may be formed to be less than ½ of a width of the insulating layer 251. Like this, by reducing the widths of the metal bridge line electrodes 271, 272, visibility that is visible to the naked eye may be reduced.

As described above, FIG. 3 and FIG. 4 explain examples in which the metal bridge line electrodes are formed in one slit shape or two slit shapes which is or are configured of two or three metal bridge line electrodes, respectively. However, the present invention is not limited to the metal bridge line electrodes and the number of slits. The metal bridge line electrodes may be formed in two or more slit shapes by three or more metal bridge line electrodes.

Furthermore, the metal bridge line electrodes 271, 272 in the exemplary embodiments of FIG. 3 and FIG. 4 may be formed with a micro line electrode. At this time, the micro line electrode is formed in a thickness of 1 to 10 μm. Like this, when the micro line electrode is formed in the thickness of 1 to 10 μm, the metal bridge line electrodes may be invisible to the user's naked eye, and at the same time, electric conductivity may be also maintained.

When the metal bridge line electrodes are formed in a thickness of less than 1 μm, the problem in electric conductivity may be generated. When the metal bridge line electrodes are formed in a thickness of more than 10 μm, the problem that the metal line electrodes are visible to the user's eyes may be generated.

Also, the metal bridge line electrodes according to an exemplary embodiment of the present invention may be formed of at least any one of an Ag nano wire and a carbon nano tube (CNT). Also, in another exemplary embodiment of the present invention, for the substrate 200 on which the conductive pattern 220 and the second conductive pattern 230 are disposed, a substrate formed of any one of PET (polyethylene terephthalate resin), PC (polycarbonate), PMMA (polymethyl methacrylate), TAC (triacetate cellulose) and PES (polyether sulfone) may be used.

In general, LCD is displayed in black when it is in off state. Thus, it is problematic that the bridge electrodes 271 are visible to the naked eye due to a difference in reflectance and color with the LCD. However, according to the present invention, the bridge electrodes 271 are formed of the thin metal bridge line electrodes, thereby reducing the phenomenon that the bridge electrodes 271 is visible to the eye.

Accordingly, while securing the electric conductivity of bridge electrodes, the present invention can settle the problem that the bridge electrodes are visible to the user's naked eye.

As previously described, in the detailed description of the invention, having described the detailed exemplary embodiments of the invention, it should be apparent that modifications and variations can be made by persons skilled without deviating from the spirit or scope of the invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims and their equivalents.

The invention claimed is:

1. A touch panel, comprising:
   a substrate;
   a first conductive pattern in a first-axis direction including a plurality of first conductive pattern cells disposed on the substrate;
   a second conductive pattern in a second-axis direction including a plurality of second conductive pattern cells disposed on the substrate;
   an insulating layer disposed on the substrate;
   a plurality of metal bridges disposed on a one surface of the insulating layer so that the second conductive pattern cells are connected to each other; and
   a conductive lead disposed on another surface of the insulating layer;
   wherein adjacent first conductive pattern cells of the plurality of first conductive pattern cells are connected to each other by the conductive lead,
   wherein the plurality of metal bridges comprise two or more metal bridges,
   wherein the plurality of metal bridges are disposed to be in parallel to each other,
   wherein a sum of widths of the plurality of metal bridges is smaller than half of a width of the insulating layer,
   wherein the first conductive pattern cells, the second conductive pattern cells, and the conductive lead each comprises Indium Tin Oxide;
   wherein a length of one metal bridge of the plurality of metal bridges in the second-axis direction is longer than a length of the insulating layer in the second-axis direction,
   wherein the length of the metal bridge in the second-axis direction is shorter than a length of each first conductive pattern cell in the second-axis direction,
   wherein a width of an ending portion of each first conductive pattern cell in the second-axis direction connected with the conductive lead is smaller than a width of a central portion of the same first conductive pattern cell in the second-axis direction,
   wherein a width of an ending portion of each second conductive pattern cell in the first-axis direction connected with a corresponding metal bridge is smaller than a width of a central portion of the same second conductive pattern cell in the first-axis direction,
   wherein a width of the insulation layer in the first-axis direction is smaller than a width of the insulation layer in the second-axis direction,
   wherein the first conductive pattern, the second conductive pattern, and the conductive lead each includes a same first conductive material;
   wherein the plurality of metal bridges include a second conductive material,
   wherein the first conductive material and the second conductive material are different from each other,
   wherein each metal bridge is in direct physical contact with a top surface of the second conductive pattern,
   wherein a width of each metal bridge is smaller than a width of the conductive lead,
   wherein a distance between adjacent metal bridges of the plurality of metal bridges is greater than a width of each of the metal bridges, and
   wherein a sum of widths of the plurality of metal bridges is smaller than a width of the conductive lead.

2. The touch panel of claim 1, wherein the insulating layer is disposed on the conductive lead which is disposed on the substrate.

3. The touch panel of claim 1, wherein the insulating layer is disposed on the second conductive pattern cells which are disposed on the substrate.

4. The touch panel of claim 1, wherein the insulating layer is disposed on the conductive lead and the second conductive pattern cells are disposed on the substrate.

5. The touch panel of claim 1, wherein the metal bridges are disposed on the conductive lead which is disposed on the substrate.

6. The touch panel of claim 1, wherein the plurality of metal bridges are formed on a same plane and in a slit-like shape to face each other.

7. The touch panel of claim 1, wherein the plurality of metal bridges have line electrodes.

8. The touch panel of claim 1, wherein the metal bridges are formed in a shape of a pair of thin metal bridge lines facing each other.

9. The touch panel of claim 1, wherein a length of the insulating layer in the second-axis direction is longer than a length of the conductive lead in the first-axis direction.

10. The touch panel of claim 9, wherein the insulating layer is in direct contact with a top surface of the conductive lead and a top surface of the second conductive pattern cell.

* * * * *